(12) United States Patent
Scuderi et al.

(10) Patent No.: US 9,473,081 B2
(45) Date of Patent: Oct. 18, 2016

(54) CIRCUITS AND METHODS FOR REDUCING SUPPLY SENSITIVITY IN A POWER AMPLIFIER

(71) Applicant: QUALCOMM Incorporated, San Diego, CA (US)

(72) Inventors: Antonino Scuderi, San Diego, CA (US); Aristotele Hadjichristos, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 23 days.

(21) Appl. No.: 14/518,967

(22) Filed: Oct. 20, 2014

(65) Prior Publication Data

US 2016/0112018 A1    Apr. 21, 2016

(51) Int. Cl.
*H03F 3/68* (2006.01)
*H03F 3/19* (2006.01)
(Continued)

(52) U.S. Cl.
CPC ............... *H03F 3/19* (2013.01); *H03F 1/223* (2013.01); *H03F 1/56* (2013.01); *H03F 3/193* (2013.01); *H03F 3/211* (2013.01); *H03F 3/245* (2013.01); *H03F 3/72* (2013.01); *H03G 1/0029* (2013.01); *H03G 1/0088* (2013.01); *H03G 3/001* (2013.01); *H03G 3/007* (2013.01); *H03F 2200/18* (2013.01); *H03F 2200/222* (2013.01); *H03F 2200/231* (2013.01); *H03F 2200/234* (2013.01); *H03F 2200/249* (2013.01); *H03F 2200/252* (2013.01); *H03F 2200/321* (2013.01); *H03F 2200/366* (2013.01); *H03F 2200/387* (2013.01); *H03F 2200/411* (2013.01); *H03F 2200/42* (2013.01); *H03F 2200/432* (2013.01); *H03F 2200/451* (2013.01); *H03F 2200/522* (2013.01); *H03F 2200/555* (2013.01); *H03F 2200/61* (2013.01); *H03F 2200/75* (2013.01); *H03F 2203/21106* (2013.01);
(Continued)

(58) Field of Classification Search
CPC .......................................... H03F 3/19
USPC ....... 330/124 R, 295, 310, 311, 51, 136, 285
See application file for complete search history.

(56) References Cited

U.S. PATENT DOCUMENTS 5,872,481 A    2/1999    Sevic et al.
6,157,253 A    12/2000    Sigmon et al.
(Continued)

FOREIGN PATENT DOCUMENTS

WO    2014037926 A2    3/2014

OTHER PUBLICATIONS

International Search Report and Written Opinion—PCT/US2015/055369—ISA/EPO—Dec. 3, 2015.

*Primary Examiner* — Khanh V Nguyen
*Assistant Examiner* — Khiem Nguyen
(74) *Attorney, Agent, or Firm* — Haynes and Boone, LLP

(57) ABSTRACT

In one embodiment, the present disclosure includes a circuit comprising a first power amplifier stage having an input to receive an input signal, an output coupled to an output node, the first power amplifier stage receiving a time-varying power supply voltage. The circuit further includes a second power amplifier stage configured in parallel with the first power amplifier stage having an input to receive the input signal, an output coupled to the output node, the second power amplifier stage receiving the time-varying power supply voltage. A first gain of the first power amplifier stage decreases when the power supply voltage is in a first low voltage range, and a second gain of the second power amplifier stage compensates for the decreasing gain of the first power amplifier stage in the first low voltage range.

20 Claims, 6 Drawing Sheets

(51) Int. Cl.
　　*H03F 1/56*　　　(2006.01)
　　*H03F 3/21*　　　(2006.01)
　　*H03F 1/22*　　　(2006.01)
　　*H03F 3/193*　　 (2006.01)
　　*H03F 3/24*　　　(2006.01)
　　*H03F 3/72*　　　(2006.01)
　　*H03G 1/00*　　　(2006.01)
　　*H03G 3/00*　　　(2006.01)

(52) U.S. Cl.
　　CPC ............... *H03F 2203/21136* (2013.01); *H03F 2203/21139* (2013.01); *H03F 2203/21142* (2013.01); *H03F 2203/21178* (2013.01); *H03F 2203/7215* (2013.01); *H03F 2203/7236* (2013.01)

(56) References Cited

U.S. PATENT DOCUMENTS

| | | | |
|---|---|---|---|
| 7,893,770 B2 * | 2/2011 | Yamauchi | H03F 1/0238 330/124 R |
| 2011/0032035 A1 | 2/2011 | Pletcher et al. | |
| 2012/0188018 A1 | 7/2012 | Yahav et al. | |
| 2013/0222062 A1 | 8/2013 | Park et al. | |
| 2014/0049322 A1 * | 2/2014 | Jeon | H03F 1/0222 330/285 |
| 2014/0113573 A1 | 4/2014 | Khatri et al. | |
| 2014/0167841 A1 | 6/2014 | Henshaw et al. | |

* cited by examiner

CIRCUITS AND METHODS FOR REDUCING SUPPLY SENSITIVITY IN A POWER AMPLIFIER

BACKGROUND

The present disclosure relates to power amplifier circuits and methods, and in particular, to circuits and methods for reducing supply sensitivity in a power amplifier.

A power amplifier is a type of electronic amplifier used to convert a low-power signal, such as a radio-frequency (RF) signal, into a larger signal of significant power, typically for driving a load such as an antenna of a transmitter.

One common application of power amplifiers is in wireless systems. Wireless systems typically include a transmitter and receiver coupled to an antenna to send and receive RF signals. Generally, a baseband system generates a digital signal that includes encoded information (data), and the digital signal is converted to an analog signal for transmission. The analog signal is processed and typically modulated (up converted) to an RF carrier frequency. After up conversion, the RF signal is coupled to an antenna through a power amplifier. The power amplifier increases the signal power so that the RF signal can communicate with a remote system, such as a base station, for example.

Wireless systems require power amplifiers with appropriate gain for amplifying RF signals for transmission with high efficiency. In some applications, power amplifier efficiency may be improved by changing the power supply voltage, Vdd, provided to the power amplifier as the envelope of the RF signal to be transmitted changes. However, changing the power supply voltage also changes the characteristics and behavior of the circuitry inside the power amplifier. Existing solutions for reducing these deleterious effects while maintaining high efficiency are not optimal for meeting the increasing demands of the electronics industry.

SUMMARY

The present disclosure includes circuits and methods for reducing supply sensitivity in a power amplifier. In one embodiment, the present disclosure includes a circuit comprising a first power amplifier stage having an input to receive an input signal, an output coupled to an output node, the first power amplifier stage receiving a time-varying power supply voltage and a second power amplifier stage configured in parallel with the first power amplifier stage having an input to receive the input signal, an output coupled to the output node, the second power amplifier stage receiving the time-varying power supply voltage, where a first gain of the first power amplifier stage decreases when the power supply voltage is in a first low voltage range, and wherein a second gain of the second power amplifier stage compensates for the decreasing gain of the first power amplifier stage in the first low voltage range.

In one embodiment, the first power amplifier stage comprises a first transistor, the first transistor having a control terminal coupled to receive the input signal and a first terminal coupled to the power supply voltage through the output node, and wherein the second power amplifier stage comprises a second transistor, the second transistor having a control terminal coupled to receive the input signal and a first terminal coupled to the power supply voltage through one or more stacked transistors and the output node.

In one embodiment, the first transistor is first device type and the second transistor is a second device type.

In one embodiment, the first transistor and the second transistor are coupled to different gate bias voltages.

In one embodiment, the first transistor and the second transistor are coupled to the same gate bias voltage.

In one embodiment, the one or more stacked transistors are two transistors configured in cascode.

In one embodiment, the second transistor comprises a plurality of segments, and wherein a different number of segments are activated based on the power supply voltage.

In one embodiment, the one or more of the segments comprise a source, a gate, and drain, a first switch coupled between the gate and a reference voltage, and a second switch coupled to the gate.

In one embodiment, the drains of the segments are coupled together, the sources of the segments are coupled together, and wherein when a segment is activated the first switch on a particular segment is opened and the second switch is closed to turn on the particular segment, and wherein when the segment is not activated the first switch is closed and the second switch is opened to turn off the particular segment.

In one embodiment, the first power amplifier stage comprises a first high voltage transistor, the first high voltage transistor having a control terminal coupled to receive the input signal and a first terminal coupled to the power supply voltage through the output node, and wherein the second power amplifier stage comprises a second standard transistor, the second standard transistor having a control terminal coupled to receive the input signal and a first terminal coupled to the power supply voltage through at least one high voltage transistor and the output node.

In another embodiment, the present disclosure includes a method comprising receiving an input signal in a first power amplifier stage, and in accordance therewith, producing an output signal on an output node, the first power amplifier stage receiving a time-varying power supply voltage, and receiving the input signal in a second power amplifier stage configured in parallel with the first power amplifier stage, and in accordance therewith, producing the output signal on the output node, the second power amplifier stage receiving the time-varying power supply voltage, where a first gain of the first power amplifier stage decreases when the power supply voltage is in a first low voltage range, and wherein a second gain of the second power amplifier stage compensates for the decreasing gain of the first power amplifier stage in the first low voltage range.

In another embodiment, the present disclosure includes a circuit comprising first power amplifier means having an input to receive an input signal, an output coupled to an output node, the first power amplifier stage receiving a time-varying power supply voltage, and second power amplifier means configured in parallel with the first power amplifier means having an input to receive the input signal, an output coupled to the output node, the second power amplifier stage receiving the time-varying power supply voltage, wherein a first gain of the first power amplifier means decreases when the power supply voltage is in a first low voltage range, and wherein a second gain of the second power amplifier means compensates for the decreasing gain of the first power amplifier means in the first low voltage range.

The following detailed description and accompanying drawings provide a better understanding of the nature and advantages of the present disclosure.

DETAILED DESCRIPTION

The present disclosure pertains to power amplifier circuits. In the following description, for purposes of explanation, numerous examples and specific details are set forth in order to provide a thorough understanding of the present disclosure. It will be evident, however, to one skilled in the art that the present disclosure as expressed in the claims may include some or all of the features in these examples alone or in combination with other features described below, and may further include modifications and equivalents of the features and concepts described herein.

Figure 1:
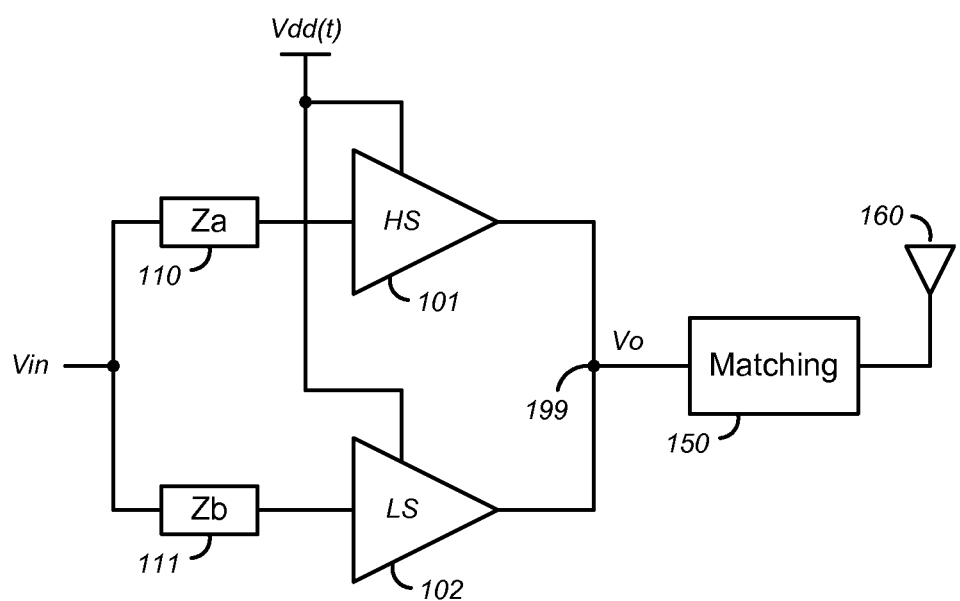
FIG. 1 illustrates a power amplifier circuit according to one embodiment.

FIG. 1 illustrates a power amplifier circuit 100 according to one embodiment. Embodiments of the present disclosure include a power amplifier circuit including two stages working in parallel that receive a time-varying power supply voltage, Vdd(t). A time-varying power supply voltage is a power supply voltage, Vdd, that changes over time to different voltage levels. Example applications where the power supply voltage varies with time include envelope tracking and average power tracking applications in a wireless transmitter, for example.

Power amplifier circuit 100 includes a first power amplifier stage 101 having an input to receive an input signal Vin through circuit Za 110 and an output coupled to an output node 199 to produce an output signal, Vo. The first power amplifier stage 101 receives a time-varying power supply voltage, Vdd(t). Stage 101 may be configured with circuits that are very efficient but have a high sensitivity to power supply voltage. For example, a gain of the first power amplifier stage 101 may decrease when the power supply voltage is in a first low voltage range (e.g., as Vdd(t) drops in value). Because stage 101 may be sensitive to changes in Vdd, stage 101 may be referred to as a high sensitivity ("HS") stage, for example.

Features and advantages of the present disclosure include a second power amplifier stage 102 in parallel with the first power amplifier stage 101 to compensate for changes in gain in the first stage 101 caused by changes in Vdd(t). Second power amplifier stage 102 is configured in parallel with the first power amplifier stage 101 and has an input to receive the input signal Vin through circuit Zb 111 and an output coupled to the output node 199 to produce output signal Vo. Circuits Za and Zb may be scaled decoupling and/or matching components or shorts as described in examples below, for example. The output signal may be an output voltage coupled to an antenna 160 through a matching circuit 150, for example. Second power amplifier stage 102 also receives the time-varying power supply voltage, Vdd(t). In this example, the outputs of stage 101 and 102 are coupled together at node 199 in a shunt configuration. As mentioned above, the gain of the first power amplifier stage 101 decreases when the power supply voltage is in a first low voltage range. Embodiments of the present disclosure include a second stage 102 where a gain of the second power amplifier stage 102 compensates for the decreasing gain of the first power amplifier stage 101 in the first low voltage range. Accordingly, in some example embodiments the second stage 102 and first stage 101 may work together to maintain a composite gain of the first power amplifier stage 101 and the second power amplifier stage 102 approximately constant over the first low voltage range.

Figure 2:
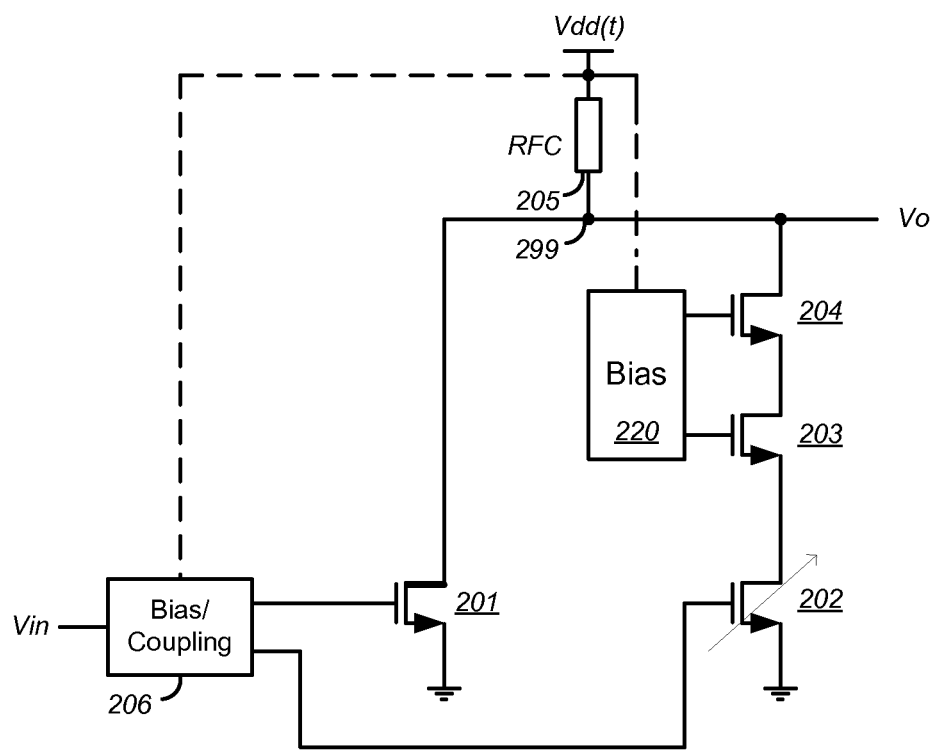
FIG. 2 illustrates an example power amplifier circuit according to another embodiment.

FIG. 2 illustrates an example power amplifier circuit according to another embodiment. In this illustrative example, a first power amplifier stage comprises a first transistor 201. Transistor 201 includes a control terminal (e.g., a gate) coupled to receive the input signal Vin, a first terminal (e.g., a drain) coupled to a time-varying power supply voltage Vdd(t) through an output node 299, and a second terminal (e.g., a source) which in this case is coupled to ground. A second power amplifier stage comprises a second transistor 202. Transistor 202 has a control terminal (e.g., a gate) coupled to receive the input signal Vin, a first terminal (e.g., a drain) coupled to the power supply voltage Vdd(t) through one or more cascode transistors and the output node 299. Input signal Vin is coupled to the inputs of transistors 201 and 202 through bias and/or coupling circuits 206, which in some embodiments may be coupled to the power supply voltage, for example. In this example, the second stage uses two cascode (stacked) transistors 203 and 204. A bias circuit 220 generates bias voltages to the gates of transistors 203 and 204 to set the bias points on each device. In some embodiments, bias circuit 220 may be coupled to the power supply voltage so that the bias on transistors 203 and 204 changes with Vdd, for example. In this example, the output of the first stage is taken at the drain of transistor 201 and the output of the second stage is taken at the drain of cascode transistor 204, which are both coupled to output node 299 to produce an output signal Vo. Node 299 is coupled to the power supply voltage Vdd(t) through an RF choke (RFC) 205, such as an inductor, for example.

In some embodiments, transistor 201 is a first device type and transistor 202 is a second device type. For example, transistor 201 may be a high voltage MOS (HVMOS) device and transistor 202 may be a different device available on a particular process (e.g., such as a standard MOS device and not and HVMOS device). HVMOS devices may be specially designed transistors capable of withstanding higher voltages than standard transistors available on a fabrication process while still being capable of operating at very high speeds required for high frequency RF power amplifier applications, for example. However, HVMOS transistor devices may experience a drop in gain as the power supply voltage decreases. In contrast, a cascode stage comprising transistors 202-204 may be less sensitive to decreases in Vdd because the bias voltage provided to cascode transistor 203 is transferred to the source of transistor 203 and drain of transistor 202, which reduces the effects of a decreasing power supply voltage on the drain of transistor 202. Accordingly, amplification through transistors 202-204 compensates for a decreasing gain of transistor 201 across a first low voltage range as the power supply decreases. However, amplification using transistor 202 and cascode devices 203-204 may be less efficient because of resistive losses in devices 203-204 between the drain of transistor 201 and node 299. Advantageously, the first stage (device 201) provides high efficiency amplification at high power supply voltages and, when the gain of the first stage decreases at low power supply voltages, the second stage (devices 202-204) gain compensates for the reduction in gain in the first stage. In some embodiments, cascode transistors 203 and 204 may be replaced with a single HVMOS transistor device, for example, capable of withstanding high voltage and able to operate efficiently at very high frequencies, for example. Transistor 202 may be another device available on the fabrication process, for example, and not an HVMOS device. It is to be understood that while two stacked devices 203 and 204 are shown in this example, a different number of stacked devices could also be used depending on the power supply voltage and the breakdown voltage of the stacked devices. For example, in another example embodiment, three (3) stacked devices may be used. In this example, HVMOS device 201 is denoted using darker shading between the drain and the gate of the symbol for the transistor. Further, an arrow through transistor 202 indicates that in some example embodiments, transistor 202 may comprise a plurality of segments. A transistor segment is a term known in the art, and typically refers to a transistor that is segmented by sub-dividing one transistor structure (or layout geometry) into separate device elements (in whole or in part). As described in more detail below, a different number of segments of transistor 202 may be activated based on the power supply voltage to change the size of transistor 202, for example.

Figure 3:
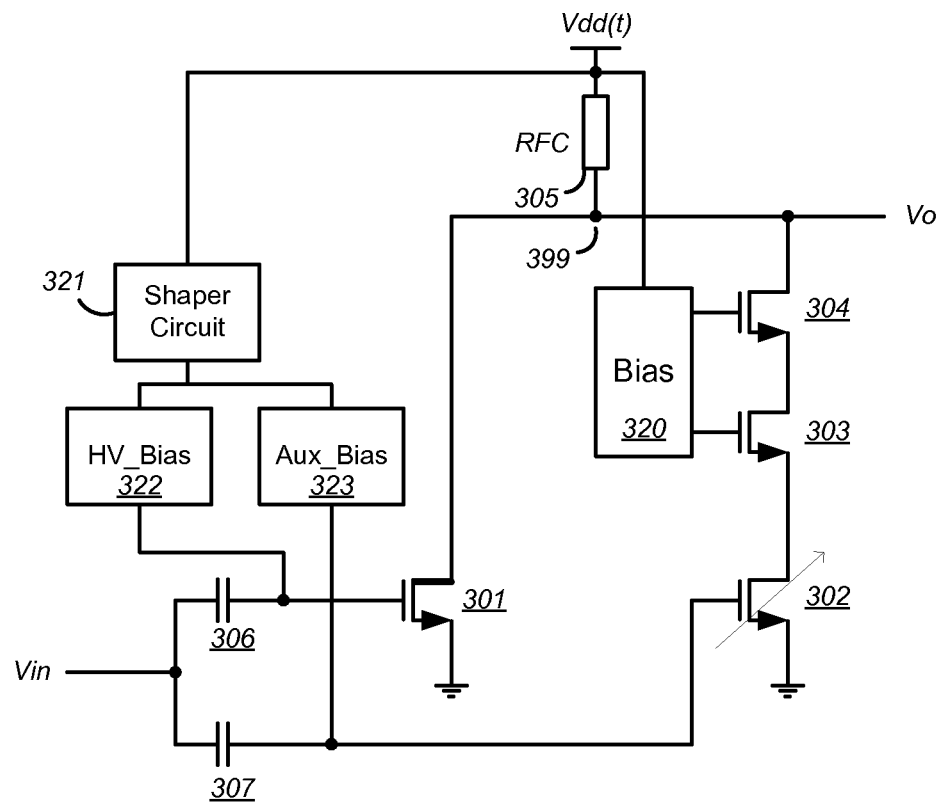
FIG. 3 illustrates a power amplifier circuit with separate stage biasing according to one embodiment.

FIG. 3 illustrates a power amplifier circuit with separate stage biasing according to one embodiment. In this example, a first stage HVMOS transistor 301 has a gate coupled to Vin through capacitor 306, a source coupled to ground, and a drain coupled to output node 399. A second stage transistor 302 has a gate coupled to Vin through capacitor 307, a source coupled to ground, and a drain coupled to node 399 through cascode transistors 303 and 304. Cascode transistors 303 and 304 receive bias voltages from bias circuit 320, which is coupled to power supply voltage Vdd(t) to adjust the bias on transistor 303 and 304 as Vdd changes, for example. Output node 399 is coupled to power supply voltage Vdd(t) and provides an output signal Vo to an antenna, for example.

In this example, transistor 301 and transistor 302 receive different gate bias voltages. The gate of transistor 301 is coupled to a first high voltage bias circuit (HV_Bias) 322 and the gate of transistor 302 is coupled to an auxiliary bias circuit (Aux_Bias) 323. HV_Bias 322 and Aux_Bias 323 may be configured to produce voltages to set the bias points on transistors 301 and 302, respectively, to optimize performance (e.g., gain, linearity) of the combined stages to operate efficiently across the full range of power supply voltages, for example. In this example, a shaper circuit 321 may have an input coupled to the power supply voltage and outputs coupled to HV_Bias 322 and Aux_Bias 323 to independently modify each bias voltage at the input of transistors 301 and 302 based on the level of Vdd, for example.

Figure 4:
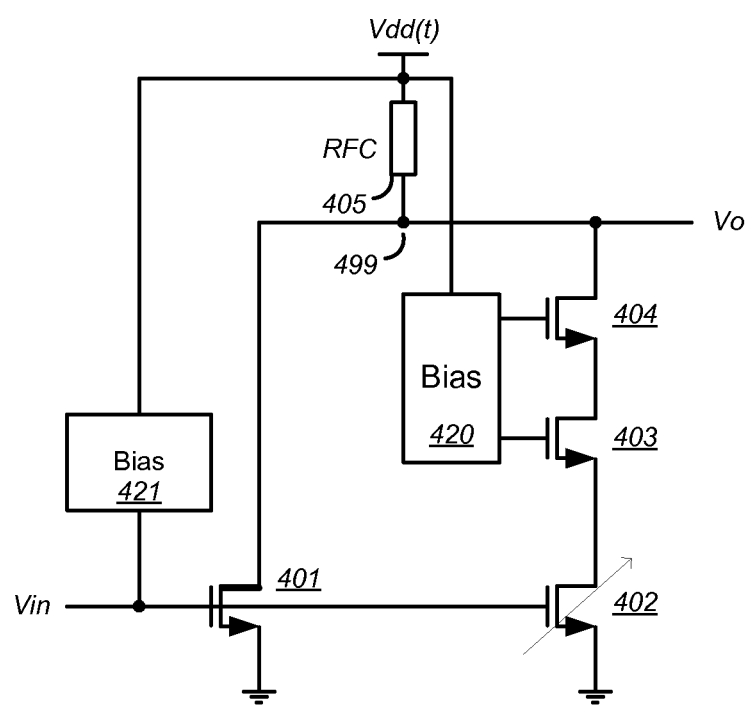
FIG. 4 illustrates a power amplifier circuit with common stage biasing according to one embodiment.

FIG. 4 illustrates a power amplifier circuit with common stage biasing according to one embodiment. In this example, first stage transistor 401 has a gate coupled to Vin, a source coupled to ground, and a drain coupled to node 499 (Vo). Second stage transistor 402 has a gate coupled to Vin, a source coupled to ground, and a drain coupled to node 499 (Vo) through cascode transistors 403 and 404. Cascode transistors 403 and 404 are biased by bias circuit 420, which may adjust the biasing based on Vdd, for example. In this example, the gates of both transistors 401 and 402 are coupled to a common bias circuit 421 to receive the same gate bias voltage. The output of the first stage at the drain of transistor 401 and the output of the second stage at the drain of transistor 404 are shunted together at node 499 to produce an output signal Vo. Output signal Vo is isolated from the supply by RFC 405 configured between the power supply and output node 499.

Figure 5:
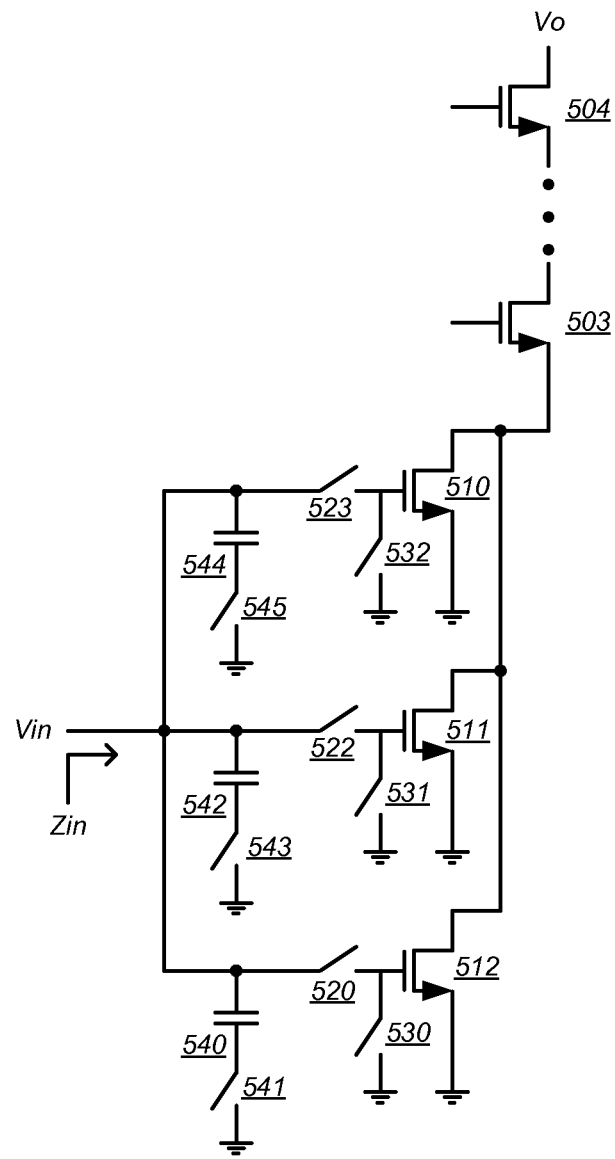
FIG. 5 illustrates an example power amplifier circuit with a segmented transistor according to another embodiment.

FIG. 5 illustrates an example power amplifier circuit with a segmented transistor according to another embodiment. The present example shown in FIG. 5 illustrates three segments 510, 511, and 512 of a transistor. Transistor segments 510-512 each have a source, a gate, and a drain, where the sources are coupled to ground and drains are coupled together. A gate of segment 510 is coupled to a first switch 532 for selectively coupling the gate to ground and a second switch 523 for selectively coupling the gate to input signal Vin. Similarly, a gate of segment 511 is coupled to a third switch 531 for selectively coupling the gate to ground and a fourth switch 522 for selectively coupling the gate to input signal Vin. Likewise, the gate of segment 512 is coupled to a fifth switch 530 for selectively coupling the gate to ground and a sixth switch 520 for selectively coupling the gate to input signal Vin. When one of the switches 530-532 are closed and the corresponding switches 520-523 are open, the corresponding transistor is turned off and removed from the circuit. When one of the switches 520-523 are closed and the corresponding switches 530-532 are open, the corresponding transistor is turned on and receives input signal Vin (and a gate bias voltage). The switches may be controlled by control instructions from a modem or microcontroller, for example, or from specialized circuitry tracking an average Vdd or other parameters, for example. Changing the number of segments receiving and amplifying Vin changes the size of the input transistor in the second stage, which in turn changes the transconductance of the transistor and gain of the stage.

In some embodiments, the time to turn the segments on and off may be much smaller than an envelope of the input signal, which allows segments to be turned on and off as the power supply voltage changes to change the size of the transistor and characteristics of the cascode stage as Vdd changes, for example. For instance, if a device segment is capable of turning on and/or off at a frequency of 50-100 MHz, then segments may be turned on and off to change the size of a transistor (e.g., transistor 202 in FIG. 2) for a 20 MHz signal envelope (e.g., LTE) without unduly impacting signal integrity. As one example, for a transistor 202 (FIG. 2) that is approximately one-sixth (1/6) the size of transistor 201, the turn on/off speed (e.g., commutation time) of transistor 202 will be correspondingly faster than transistor 201. The speed difference is further compounded by segmenting transistor 202 into a plurality of segments, where each segment is a fraction of the size, and multiple of the speed, of composite transistor 202.

Figure 6:
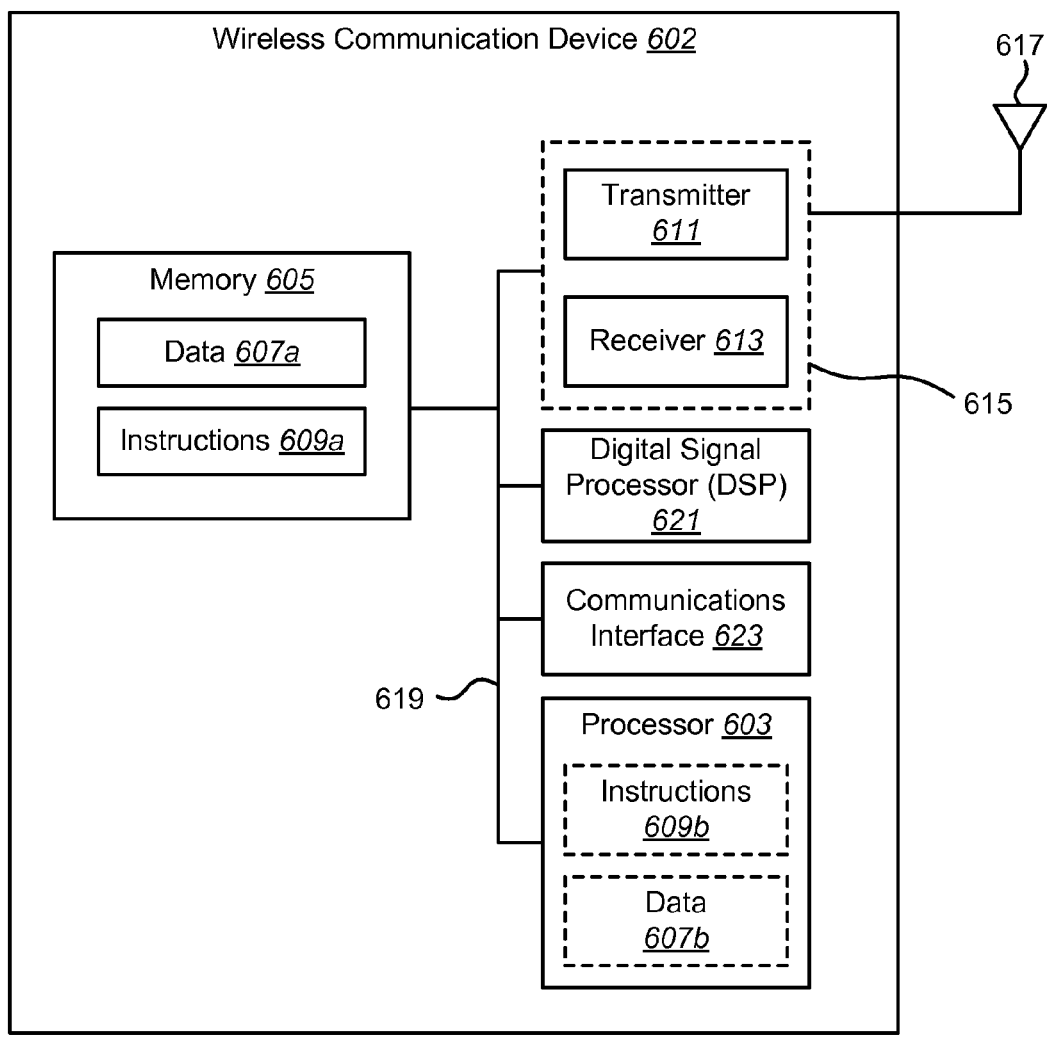
FIG. 6 illustrates a wireless communication device according to an embodiment.

FIG. 6 illustrates a wireless communication device 602 that may incorporate features of the present disclosure. The wireless communication device 602 may be an access terminal, a mobile station, a user equipment (UE), etc. The wireless communication device 602 includes a processor 603. The processor 603 may be a general purpose single- or multi-chip microprocessor (e.g., an ARM), a special purpose microprocessor (e.g., a digital signal processor (DSP)), a microcontroller, a programmable gate array, etc. The processor 603 may be referred to as a central processing unit (CPU). Although just a single processor 603 is shown in the wireless communication device 602 of FIG. 6, in an alternative configuration, a combination of processors (e.g., an ARM and DSP) could be used.

The wireless communication device 602 also includes memory 605. The memory 605 may be any electronic component capable of storing electronic information. The memory 605 may be embodied as random access memory (RAM), read-only memory (ROM), magnetic disk storage media, optical storage media, flash memory devices in RAM, on-board memory included with the processor, EPROM memory, EEPROM memory, registers and so forth, including combinations thereof.

Data 607a and instructions 609a may be stored in the memory 605. The instructions 609a may be executable by the processor 603 to implement certain aspects of the techniques disclosed herein. Executing the instructions 609a may involve the use of the data 607a that is stored in the memory 605. When the processor 603 executes the instructions 609, various portions of the instructions 609b may be loaded onto the processor 603, and various pieces of data 607b may be loaded onto the processor 603.

The wireless communication device 602 may also include a transmitter 611 and a receiver 613 to allow transmission and reception of signals to and from the wireless communication device 602 via an antenna 617. Transmitter 611 may include a power amplifier incorporating the techniques described herein. The transmitter 611 and receiver 613 may be collectively referred to as a transceiver 615. The wireless communication device 602 may also include (not shown) multiple transmitters, multiple antennas, multiple receivers and/or multiple transceivers.

The wireless communication device 602 may include a digital signal processor (DSP) 621. The wireless communication device 602 may also include a communications interface 623. The communications interface 623 may allow a user to interact with the wireless communication device 602.

The various components of the wireless communication device 602 may be coupled together by one or more buses, which may include a power bus, a control signal bus, a status signal bus, a data bus, etc. For the sake of clarity, the various buses are illustrated in FIG. 6 as a bus system 619.

The above description illustrates various embodiments of the present disclosure along with examples of how aspects of the particular embodiments may be implemented. The above examples should not be deemed to be the only embodiments, and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

What is claimed is:

1. A circuit comprising:
    a first power amplifier stage having an input to receive an input signal, an output coupled to an output node, the first power amplifier stage receiving a time-varying power supply voltage; and
    a second power amplifier stage configured in parallel with the first power amplifier stage having an input to receive the input signal, an output coupled to the output node, the second power amplifier stage receiving the time-varying power supply voltage,
    wherein a first gain of the first power amplifier stage decreases when the time-varying power supply voltage is in a first low voltage range, and wherein a second gain of the second power amplifier stage compensates for the decreasing gain of the first power amplifier stage in the first low voltage range, and
    wherein the output of the first power amplifier stage is coupled to the output of the second power amplifier stage in a shunt configuration.

2. The circuit of claim 1 wherein the first power amplifier stage comprises a first transistor, the first transistor having a control terminal coupled to receive the input signal and a first terminal coupled to the time-varying power supply voltage through the output node, and wherein the second power amplifier stage comprises a second transistor, the second transistor having a control terminal coupled to receive the input signal and a first terminal coupled to the time-varying power supply voltage through one or more stacked transistors and the output node.

3. The circuit of claim 2 wherein the first transistor is first device type and the second transistor is a second device type.

4. The circuit of claim 2 wherein the first transistor and the second transistor are coupled to different gate bias voltages.

5. The circuit of claim 2 wherein the first transistor and the second transistor are coupled to the same gate bias voltage.

6. The circuit of claim 2 wherein the one or more stacked transistors are two transistors configured in cascode.

7. The circuit of claim 2 wherein the second transistor comprises a plurality of segments, and wherein a different number of segments are activated based on the time-varying power supply voltage.

8. The circuit of claim 7 wherein the one or more of the segments comprise:
    a source, a gate, and drain;
    a first switch coupled between the gate and a reference voltage; and
    a second switch coupled to the gate.

9. The circuit of claim 8 wherein the drains of the segments are coupled together, the sources of the segments are coupled together, and wherein when a segment is activated the first switch on a particular segment is opened and the second switch is closed to turn on the particular segment, and wherein when the segment is not activated the first switch is closed and the second switch is opened to turn off the particular segment.

10. The circuit of claim 1 wherein the first power amplifier stage comprises a first high voltage transistor, the first high voltage transistor having a control terminal coupled to receive the input signal and a first terminal coupled to the time-varying power supply voltage through the output node, and wherein the second power amplifier stage comprises a second standard transistor, the second standard transistor having a control terminal coupled to receive the input signal and a first terminal coupled to the time-varying power supply voltage through at least one high voltage transistor and the output node.

11. A method comprising:
    receiving an input signal in a first power amplifier stage, and in accordance therewith, producing an output signal on an output node, the first power amplifier stage receiving a time-varying power supply voltage; and
    receiving the input signal in a second power amplifier stage configured in parallel with the first power amplifier stage, and in accordance therewith, producing the output signal on the output node, the second power amplifier stage receiving the time-varying power supply voltage,
    wherein a first gain of the first power amplifier stage decreases when the time-varying power supply voltage is in a first low voltage range, and wherein a second gain of the second power amplifier stage compensates for the decreasing gain of the first power amplifier stage in the first low voltage range, and
    wherein the output of the first power amplifier stage is coupled to the output of the second power amplifier stage in a shunt configuration.

12. The method of claim 11 wherein the first power amplifier stage comprises a first transistor, the method further comprising receiving the input signal on a control terminal of the first transistor, wherein a first terminal of the first transistor is coupled to the time-varying power supply voltage through the output node, and wherein the second power amplifier stage comprises a second transistor, the method further comprising receiving the input signal on a control terminal of the second transistor, wherein a first terminal of the second transistor is coupled to the time-varying power supply voltage through one or more stacked transistors and the output node.

13. The method of claim 12 wherein the first transistor is first device type and the second transistor is a second device type.

14. The method of claim 12 wherein the first transistor is high voltage MOS device and the second transistor is not a high voltage MOS device.

15. The method of claim 12 wherein the first transistor and the second transistor are coupled to different gate bias voltages.

16. The method of claim 12 wherein the first transistor and the second transistor are coupled to the same gate bias voltage.

17. The method of claim 12 wherein the second transistor comprises a plurality of segments, the method further comprising activating a different number of segments based on the time-varying power supply voltage.

18. The method of claim 17 wherein the one or more of the segments comprise:

a source, a gate, and drain;
a first switch coupled between the gate and a reference voltage; and
a second switch coupled to the gate.

19. The method of claim 18 wherein the drains of the segments are coupled together, the sources of the segments are coupled together, and wherein when a segment is activated the first switch on a particular segment is opened and the second switch is closed to turn on the particular segment, and wherein when the segment is not activated the first switch is closed and the second switch is opened to turn off the particular segment.

20. A circuit comprising:

first power amplifier means having an input to receive an input signal, an output coupled to an output node, the first power amplifier stage receiving a time-varying power supply voltage; and second power amplifier means configured in parallel with the first power amplifier means having an input to receive the input signal, an output coupled to the output node, the second power amplifier stage receiving the time-varying power supply voltage, wherein a first gain of the first power amplifier means decreases when the time-varying power supply voltage is in a first low voltage range, and wherein a second gain of the second power amplifier means compensates for the decreasing gain of the first power amplifier means in the first low voltage range, and wherein the output of the first power amplifier stage is coupled to the output of the second power amplifier stage in a shunt configuration.

* * * * *